(12) United States Patent
Zuo et al.

(10) Patent No.: US 12,107,058 B2
(45) Date of Patent: Oct. 1, 2024

(54) SPLIT RDL CONNECTION BETWEEN DIE AND UBM

(71) Applicant: STATS ChipPAC Pte. Ltd., Singapore (SG)

(72) Inventors: Jian Zuo, Singapore (SG); Yaojian Lin, Jiangyin (CN)

(73) Assignee: STATS ChipPAC Pte. Ltd., Singapore (SG)

( * ) Notice: Subject to any disclaimer, the term of this patent is extended or adjusted under 35 U.S.C. 154(b) by 213 days.

(21) Appl. No.: 17/445,330

(22) Filed: Aug. 18, 2021

(65) Prior Publication Data

US 2023/0056780 A1 Feb. 23, 2023

(51) Int. Cl.
*H01L 23/00* (2006.01)

(52) U.S. Cl.
CPC .............. *H01L 24/05* (2013.01); *H01L 24/03* (2013.01); *H01L 24/06* (2013.01); *H01L 2224/03011* (2013.01); *H01L 2224/0401* (2013.01); *H01L 2224/05082* (2013.01); *H01L 2224/05569* (2013.01); *H01L 2224/06515* (2013.01)

(58) Field of Classification Search
CPC ........... H01L 24/05; H01L 2224/06515; H01L 24/06; H01L 24/03
See application file for complete search history.

(56) References Cited

U.S. PATENT DOCUMENTS

| | | | |
|---|---|---|---|
| 7,977,789 B2 * | 7/2011 | Park | H01L 24/03 257/737 |
| 2010/0032843 A1 * | 2/2010 | Chen | H01L 24/05 257/E23.068 |
| 2015/0228594 A1 | 8/2015 | Alvarado et al. | |
| 2017/0263523 A1 * | 9/2017 | Ji | H01L 24/08 |

\* cited by examiner

*Primary Examiner* — Dale E Page
*Assistant Examiner* — Wilner Jean Baptiste
(74) *Attorney, Agent, or Firm* — Brian M. Kaufman; Robert D. Atkins; PATENT LAW GROUP: Atkins and Associates, P.C.

(57) ABSTRACT

A semiconductor device has a semiconductor die. A first contact pad, second contact pad, and third contact pad are formed over the semiconductor die. An under-bump metallization layer (UBM) is formed over the first contact pad, second contact pad, and third contact pad. The UBM electrically connects the first contact pad to the second contact pad. The third contact pad is electrically isolated from the UBM. Conductive traces can be formed extending between the first contact pad and second contact pad under the UBM. A fourth contact pad can be formed over the first contact pad and a fifth contact pad can be formed over the second contact pad. The UBM is then formed over the fourth and fifth contact pads.

21 Claims, 7 Drawing Sheets

SPLIT RDL CONNECTION BETWEEN DIE AND UBM

FIELD OF THE INVENTION

The present invention relates in general to semiconductor devices and, more particularly, to a semiconductor device and method of forming a split connection between a semiconductor die terminal and an under-bump metallization.

BACKGROUND OF THE INVENTION

Semiconductor devices are commonly found in modern electronic products. Semiconductor devices perform a wide range of functions, such as signal processing, high-speed calculations, transmitting and receiving electromagnetic signals, controlling electronic devices, photo-electric, and creating visual images for television displays. Semiconductor devices are found in the fields of communications, power conversion, networks, computers, entertainment, and consumer products. Semiconductor devices are also found in military applications, aviation, automotive, industrial controllers, and office equipment.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, and resistors, create a relationship between voltage and current necessary to perform electrical circuit functions.

Back-end manufacturing refers to cutting or singulating the finished wafer into the individual semiconductor die and packaging the semiconductor die for structural support, electrical interconnect, and environmental isolation. To singulate the semiconductor die, the wafer is scored and broken along non-functional regions of the wafer called saw streets or scribes. The wafer is singulated using a laser cutting tool or saw blade. After singulation, the individual semiconductor die are mounted to a package substrate that includes pins or contact pads for interconnection with other system components. Contact pads formed over the semiconductor die are then connected to contact pads within the package. The electrical connections can be made with conductive layers, bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1a shows a semiconductor wafer or panel 100 with a base substrate material 102, such as silicon, germanium, aluminum phosphide, aluminum arsenide, gallium arsenide, gallium nitride, indium phosphide, silicon carbide, or other bulk material for structural support. Wafer or panel 100 can also be a fan-out wafer with embedded die or other components. A plurality of semiconductor die, fan-out die, or components 104 is formed on or embedded in wafer or panel 100 separated by a non-active, inter-die wafer area or saw street 106. Saw street 106 provides cutting areas to singulate semiconductor wafer 100 into individual semiconductor die, fan-out die, or components 104. In one embodiment, semiconductor wafer 100 has a width or diameter of 100-450 millimeters (mm). In another embodiment, a reconstituted wafer or panel has a diameter between 200 mm and 450 mm. A rectangular panel is sized between 200 mm by 200 mm and 650 mm by 650 mm in other embodiments.

FIG. 1b shows a cross-sectional view of a portion of semiconductor wafer 100. Each semiconductor die 104 has a back or non-active surface 108 and an active surface 110 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 110 to implement analog circuits or digital circuits, such as digital signal processor (DSP), application specific integrated circuits (ASIC), memory, or other signal processing circuit. Semiconductor die 104 may also contain IPDs, such as inductors, capacitors, and resistors, for RF signal processing.

An electrically conductive layer 112 is formed over active surface 110 using PVD, CVD, electrolytic plating, electroless plating process, or other suitable metal deposition process. Conductive layer 112 can be one or more layers of aluminum (Al), copper (Cu), tin (Sn), nickel (Ni), gold (Au), silver (Ag), or other suitable electrically conductive material. Conductive layer 112 operates as contact pads electrically connected to the circuits on active surface 110.

In FIG. 1c, semiconductor wafer 100 is singulated through saw street 106 using a saw blade or laser cutting tool 118 into individual semiconductor die 104. The individual semiconductor die 104 can be inspected and electrically tested for identification of known-good die (KGD) post singulation. Contact pads 112 operate as terminals or pins of the semiconductor die. Additional conductive layers including conductive traces and conductive vias typically exist that connect contact pads 112 to the actual circuits formed on active surface 110.

Subsequent back-end manufacturing steps will envelop semiconductor die 104 in encapsulant, redistribution layers (RDL), and other structures useful to protect die 104 and interconnect with other semiconductor components. One important aspect of packaging is the formation of RDL to fan-in or fan-out the terminals of contact pads 112 to a more suitable pattern for soldering to a larger substrate. An under-bump metallization (UBM) layer is formed over the RDL to improve solder adhesion and integrity over time.

FIG. 2 shows a typical UBM layer formed over semiconductor die 104. Passivation layer 130 is commonly formed over semiconductor die 104 at the end of front-end manufacturing to protect active surface 110. Passivation layer 130 is an inorganic material in some embodiments. Openings are formed in passivation layer 130 for electrical interconnection to die pads 112. Contact pads 112 are referred to as die pads to differentiate from the later-formed RDL contact pads. Insulating layer 132 is formed over passivation layer 130 and encapsulant if an encapsulant is deposited around die 104. Openings in insulating layer 130 align with openings of passivation layer 130 to expose die pads 112.

Conductive layer 134 is formed over insulating layer 132 and includes contact pads 134a and conductive traces 134b. The contact pad 134a shown in FIG. 2 is connected to two different die pads 112: 112a and 112c. Contact pad 134a needs to be large enough to physically contact both die pads 112a and 112c through the openings in insulating layer 132. Conductive traces 134b are used to distribute electrical connections between other die pads 112 and other contact pads 134a not shown in the partial cross-section of FIG. 2.

Insulating layer 136 is formed over conductive layer 134. An opening is formed through insulating layer 136 to expose contact pad 134a. A majority of contact pad 134a is exposed, but a ring around the outside of the contact pad remains covered by insulating layer 136. UBM layer 138 is formed directly on contact pad 134a and extends onto insulating layer 136 around the outside of the contact pad. UBM layer 138 physically contacts contact pad 134a for an entire footprint of the opening in insulating layer 136. Contact pad 134a and UBM 138 have nearly the same footprints, although their widths may not be identical. A solder bump 140 is disposed on UBM layer 138. Solder bump 140 is reflowed onto a contact pad of a larger substrate for electrical integration.

One issue with forming a large UBM that covers and connects to two different die pads 112 is that the underlying RDL contact pad 134a can easily cover up other die pads 112, e.g., die pad 112b, which become difficult or practically impossible to use. Contact pad 134a also occupies valuable RDL routing space, potentially requiring additional RDL layers to do the required horizontal signal routing. Moreover, traces 134b must route around UBM 138, which increases trace length and thereby circuit resistance and heat generation.

DETAILED DESCRIPTION OF THE DRAWINGS

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings. The term "semiconductor die" as used herein refers to both the singular and plural form of the words, and accordingly, can refer to both a single semiconductor device and multiple semiconductor devices.

Figure 1A:
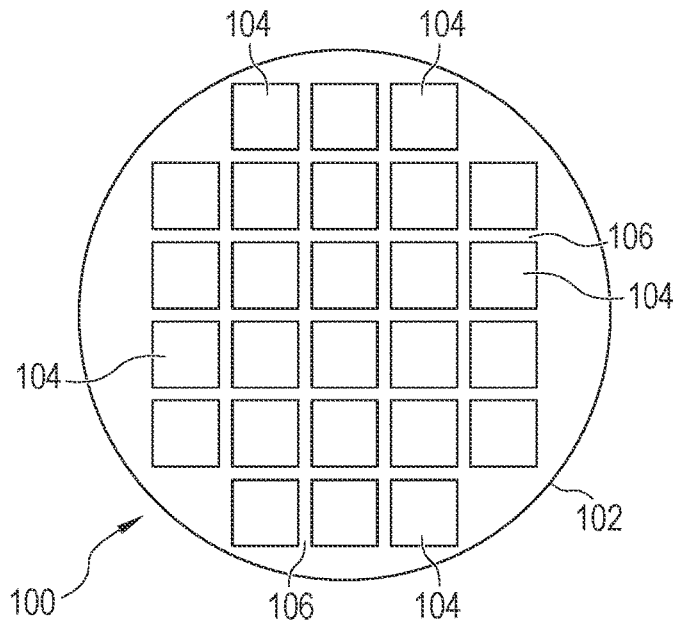
FIGS. 1a-1c illustrate a semiconductor wafer with a plurality of semiconductor die separated by a saw street.
Figure 1B:
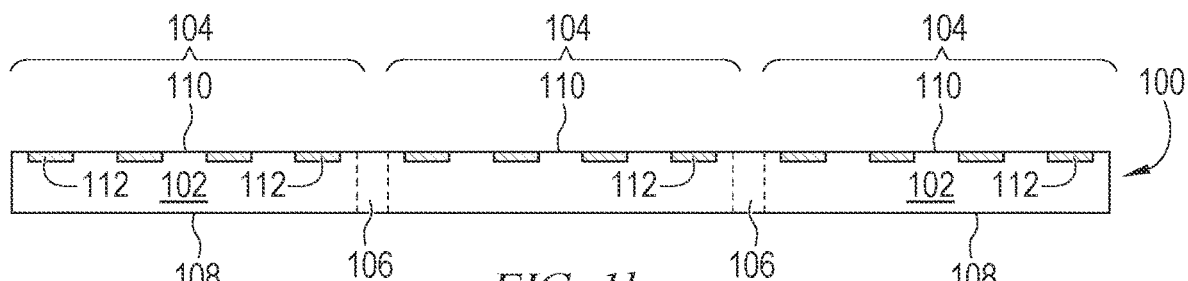
Figure 1C:
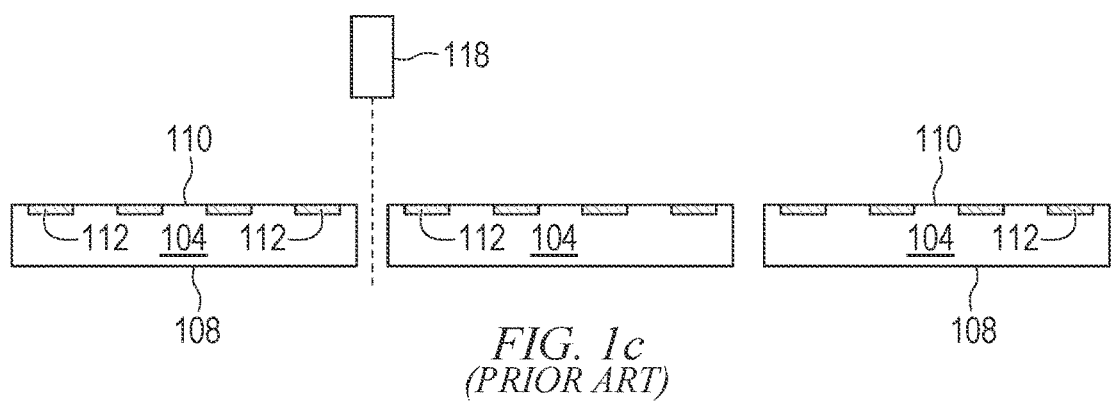
Figure 2:
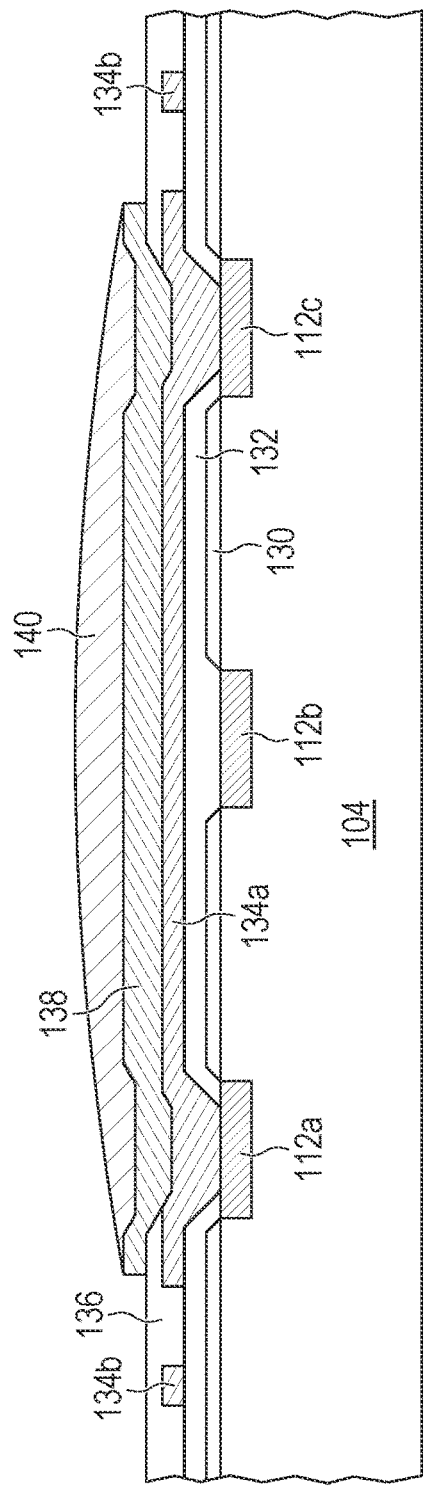
FIG. 2 illustrates RDL and UBM formed over one of the semiconductor die.
Figure 3A:
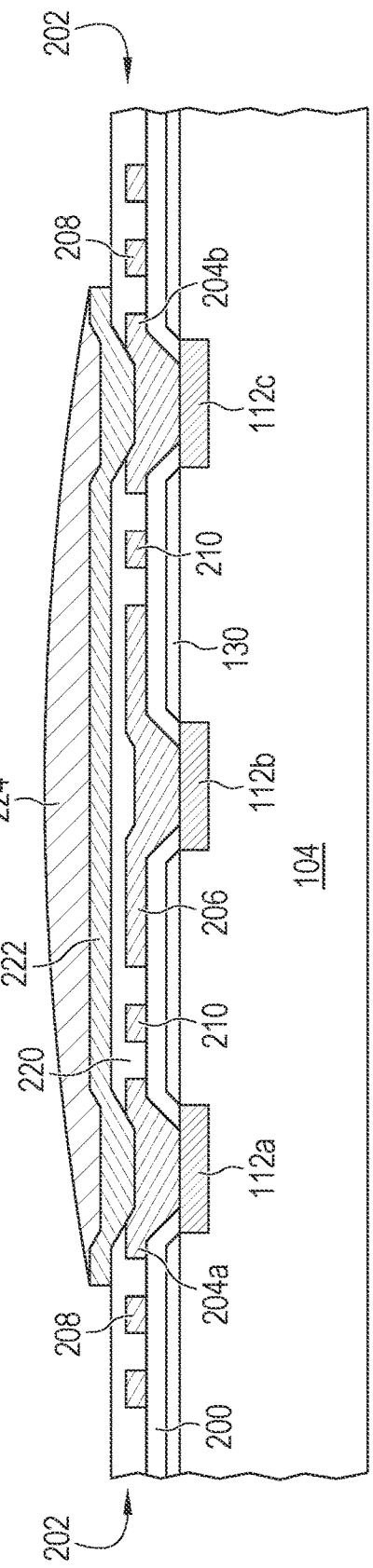
FIGS. 3a-3c illustrate split RDL pads.

FIG. 3a shows a cross-sectional view of semiconductor die 104 with an RDL and UBM formed over active surface 110. An insulating layer 200 is formed over semiconductor die 104 and passivation layer 130. In some embodiments, semiconductor die 104 is a semiconductor die embedded in encapsulant, or an encapsulant is deposited around semiconductor die 104 and passivation layer 130 after singulation, and then insulating layer 200 is also formed over the encapsulant. Insulating layer 200 contains one or more layers of silicon dioxide (SiO2), silicon nitride (Si3N4), silicon oxynitride (SiON), tantalum pentoxide (Ta2O5), aluminum oxide (Al2O3), solder resist, polyimide, benzocyclobutene (BCB), polybenzoxazoles (PBO), polymer matrix composite with a filler such as Ajinomoto build-up film (ABF) or molding compound, and other material having similar insulating and structural properties. Insulating layer 200 is formed using spin coating, sputtering, lamination, molding, or any other suitable process. Openings are formed through insulating layer 200 over die pads 112 using photolithography or another suitable patterning process.

Conductive layer 202 is formed over insulating layer 200. Conductive layer 202 can be one or more layers of Al, Cu, Ti/Cu, TiW/Cu, Sn, Ni, Au, Ag, or other suitable electrically conductive material. Conductive layer 202 is formed using PVD, CVD, electrolytic plating, electroless plating process, or other suitable metal deposition process. Conductive layer 202 is patterned into a pair of UBM connecting contact pads 204a and 204b, an RDL contact pad 206, conductive traces 208 routing around contact pads 204a and 204b, and conductive traces 210 routing between contact pads 204.

Insulating layer 220 is formed over conductive layer 202 and insulating layer 200. Insulating layer 220 is formed of similar materials and in a similar manner to insulating layer 200. Openings are formed through insulating layer 220 over contact pads 204a and 204b to expose the contact pads for a subsequent UBM formation.

UBM 222 is formed over insulating layer 220 and into the openings exposing contact pads 204a and 204b. UBM 222 is formed in a similar manner and of similar materials to conductive layer 202. In one embodiment, UBM 222 includes a wetting layer, barrier layer, and adhesion layer with differing alloy compositions. UBM 222 physically contacts contact pads 204a and 204b in the openings of insulating layer 220. Contact pads 204a and 204b connect UBM 222 to die pads 112a and 112c in parallel, but conductive layer 202 does not otherwise connect contact pad 204a to contact pad 204b or die pad 112a to die pad 112c. UBM 222 electrically couple contact pads 204a and 204b to each other, thus the UBM operates as an RDL coupling die pads 112a and 112c to each other.

An electrically conductive bump material is deposited over UBM 222 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 222 using a suitable attachment or bonding process. In one embodiment, the bump material is reflowed by heating the material above its melting point to form balls or bumps 224. Bump 224 can also be compression bonded or thermocompression bonded to UBM 222.

Figure 3B:
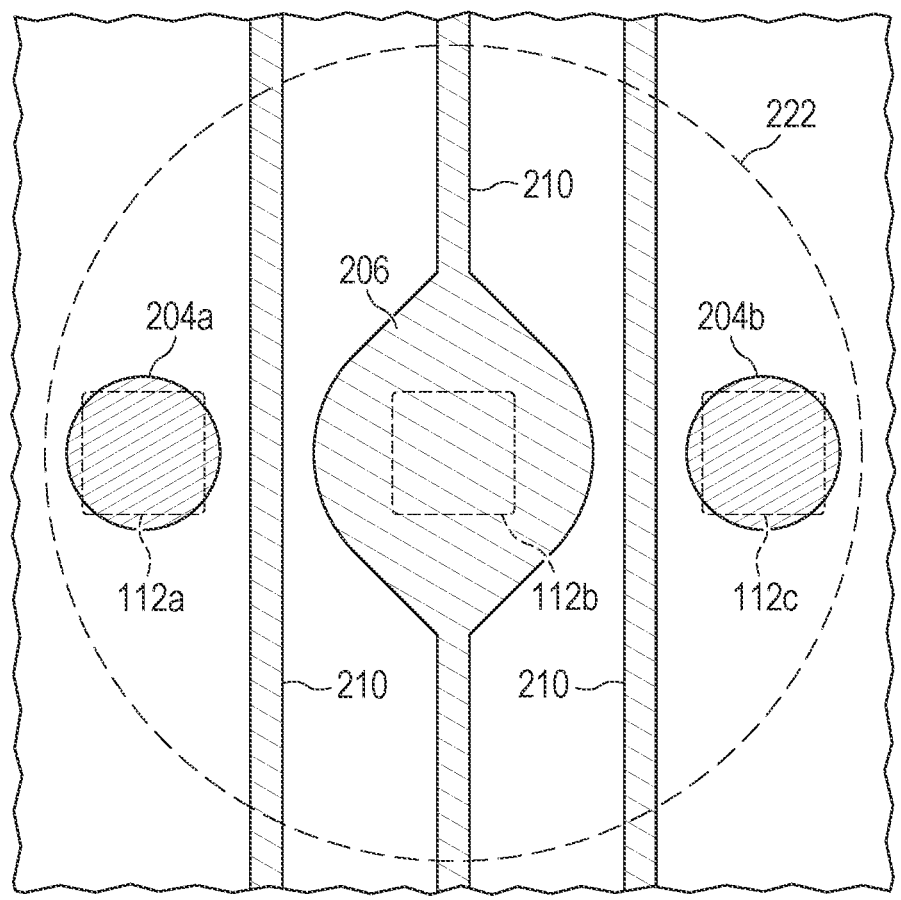

Conductive layer 202 includes a gap between contact pads 204a and 204b that allows for routing of conductive traces and placement of additional contact pads under UBM 222, whereas in the prior art the entire area under UBM was occupied by an RDL contact pad sized the same as the UBM. FIG. 3b shows a plan view of conductive layer 202. Instead of having an RDL with one large contact pad covering both die pads 112a and 112c, a pair of contact pads 204 is formed to interconnect between die 104 and UBM 222. Split contact pads 204a and 204b alleviate routing requirements for RDL because conductive traces 210 can now be routed between the split contact pads without directly connecting to the contact pads. Die pad 112b is usable even with an overlying UBM because contact pad 206 can be formed as part of conductive layer 202 without interference from a large contact pad big enough to cover both die pads 112a and 112c. Split contact pads 204a and 204b allows other contact pads 206 to be formed over die pads 112 that are under the UBM and were unusable in the prior art. While die pad 112b is shown as being directly between die pads 112a and 112b, die pad 112b and contact pad 206 could be anywhere within the footprint of UBM 222 and the same applies.

Rather than requiring an RDL layer such as conductive layer 202 to connect die pads 112a and 112c as in the prior art, UBM 222 operates as the RDL to connect the die pads to each other. Using UBM 222 as an RDL solves the problem of having underlying conductive layers cross each other to both connect die pads 112a and 112c to each other and route conductive traces 210 under the UBM. Connecting multiple die pads 112 to UBM 222 in parallel also has the benefit of reducing circuit resistance from die 104 to the UBM. Reducing resistance reduces voltage drop, heat generation, and power consumption and ensures that semiconductor die 104 remains in good condition for a longer lifetime. UBM 222 connects die pads 112 to each other horizontally while conductive layer 202 connects die pads 112 to the UBM vertically. UBM 222 acts as a metal bridge to bypass other RDL patterns underneath the UBM and connects die pads 112 from different locations to each other.

Figure 3C:
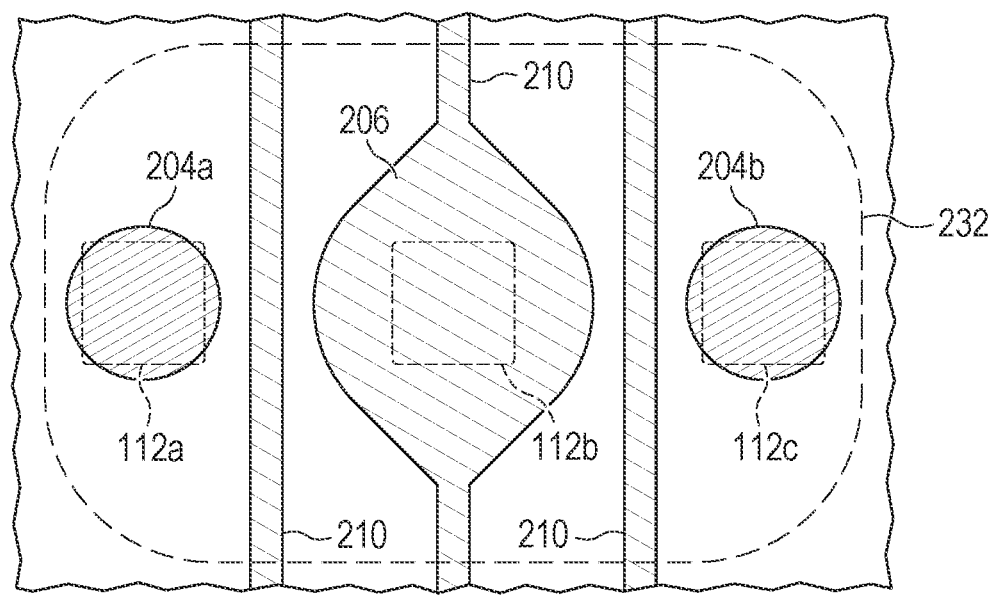

While two die pads 112 are connected to UBM 222 in parallel, any number of die pads can be vertically routed to the UBM through conductive layer 202 by using discrete contact pads 204 instead of one large contact pad. The die pads 112 are not connected to each other through conductive layer 202, but only through UBM 222 and potentially also by die 104. In other embodiments, two die pads 112 can be connected to each other and to UBM 222 by one contact pad 204, while a third die pad 112 is connected in parallel to the UBM through a separate contact pad 204. FIG. 3c shows another embodiment with a rectangular UBM 232. A UBM can be any suitable shape and formed over any number of individually or separately connected die pads 112.

Figure 4:
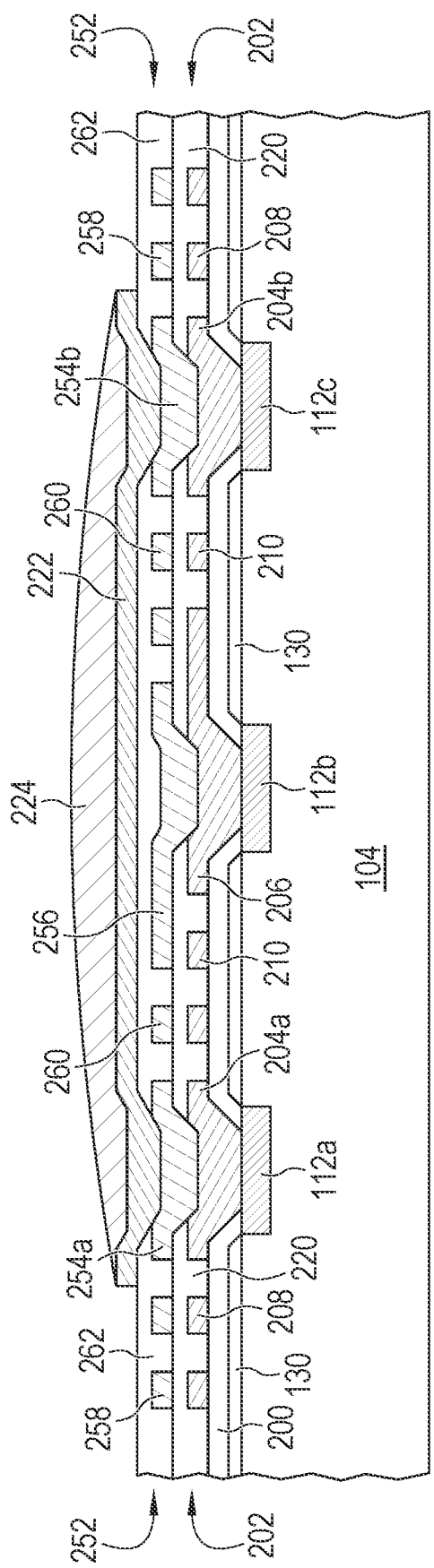
FIG. 4 illustrates multiple split RDL layers.

While FIG. 3a shows only a single RDL layer, i.e., conductive layer 202, between die pads 112 and UBM 222, any suitable number of RDL layers can be stacked to allow for more complex signal routing. FIG. 4 shows a second conductive layer 252 formed over conductive layer 202 as a second RDL layer. Insulating layer 220 has openings formed to expose contact pads 204 and 206. Conductive layer 252 includes two contact pads 254a and 254b corresponding to and stacked on contact pads 204a and 204b. Another contact pad 256 is formed between contact pads 254a and 254b and under the eventual footprint of UBM 222. Contact pad 256 is formed directly over and stacked on contact pad 206 but could also be formed laterally offset and connected by a conductive trace. Conductive traces 260 are routed between contact pads 254a and 254b without being directly electrically connected to contact pads 254a and 254b. Conductive traces 258 are routed outside of contact pads 254a and 254b.

Insulating layer 262 is formed over conductive layer 252. Openings are formed in insulating layer 262 to expose contact pads 254a and 254b. Contact pad 256 remains covered by insulating layer 262 and is connected elsewhere within the die 104 floorplan by conductive traces 258 and 260. UBM 222 is formed over insulating layer 262 and extends into the openings of insulating layer 262 onto contact pads 254a and 254b. Solder bump 224 is formed on UBM 222.

Contact pads 204a and 254a are stacked to form one vertical conductive path from die 104 to UBM 222. Contact pads 204b and 254b are stacked to form a second vertical conductive path from die 104 to UBM 222 in parallel with the first path. Contact pads 204a and 254a electrically connect die pad 112a to UBM 222 in series with each other, and in parallel with contact pads 204b and 254b connecting the UBM to die pad 112c. Having separate vertical paths for individual die pads 112 instead of one large pad over multiple die pads allows additional routing flexibility because conductive traces 210 and 230 can be routed between the vertical stacks. Having double layered contact pads connecting UBM 222 in parallel provides even more flexible routing because two layers of conductive traces can be formed through the area between die pads 112a and 112c. Any number of RDL layers can have vertically stacked contact pads to provide split signal routing between die pads 112 and UBM 222.

Figure 5A:
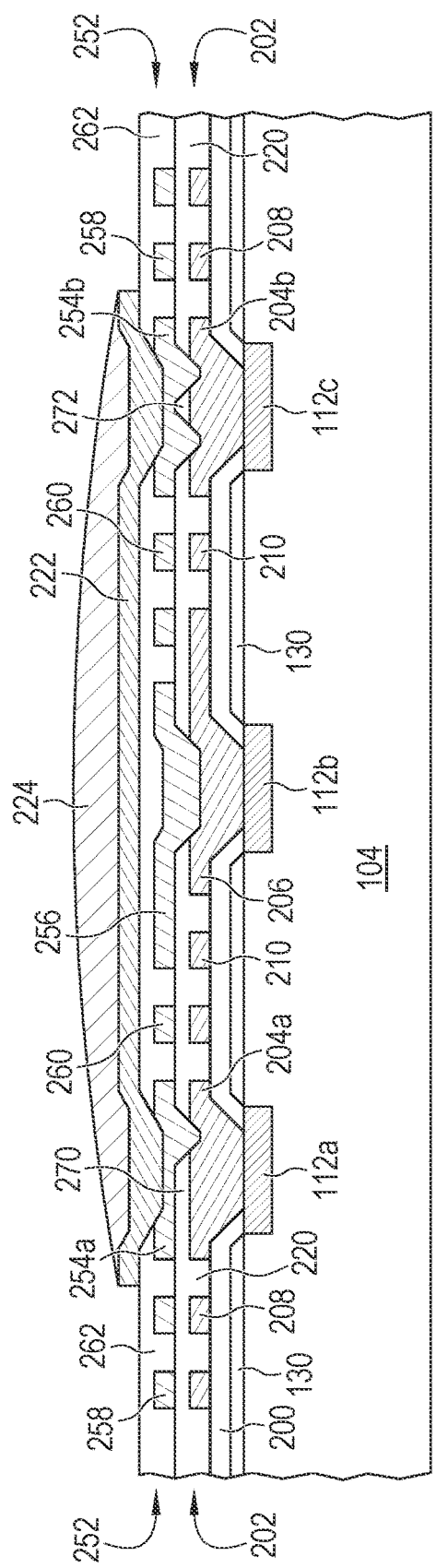
FIGS. 5a and 5b illustrate insulating layers with buffer features.
Figure 5B:
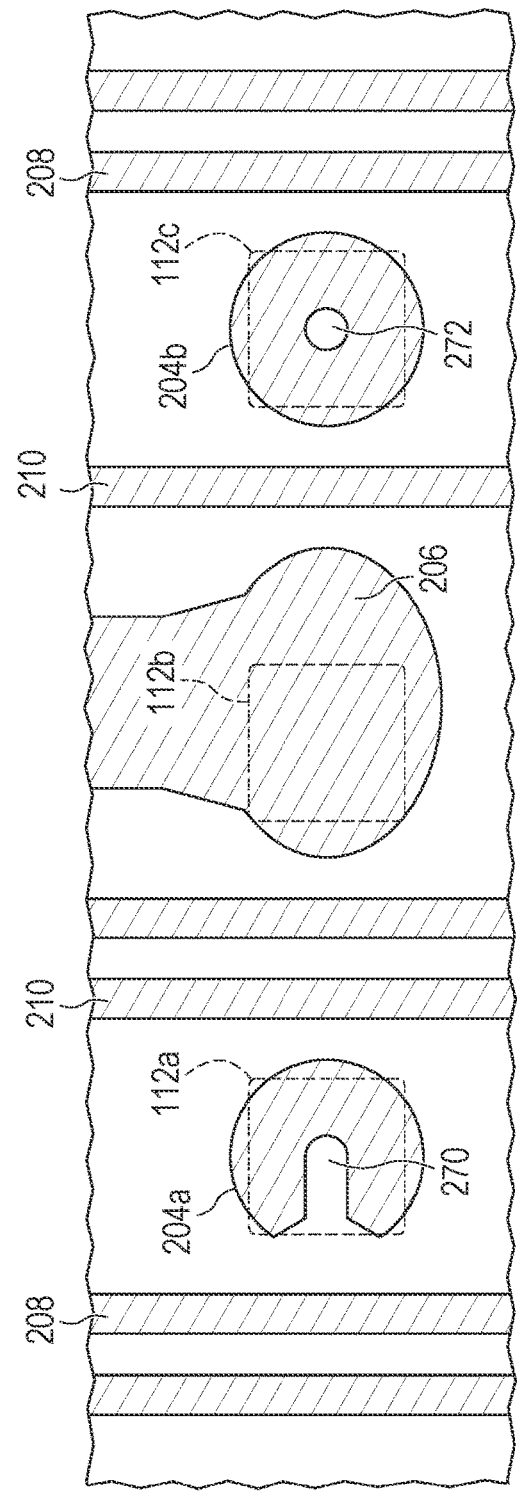

FIGS. 5a and 5b illustrate passivation buffers formed over contact pads 204a and 204b. Insulating layer 220 is patterned to form a peninsula 270 over contact pad 204a and an island 272 over contact pad 204b. Any combination of buffers peninsulas and islands can be used on any number of contact pads, but one of each is shown for purposes of illustration. Peninsula 270 could also be formed extending completely across contact pad 204a, which would form a bridge to bisect the contact pad into two discrete exposed portions. Contact pad 204a is optionally elongated in a direction perpendicular to peninsula 270 to create more surface area on either side of the peninsula.

Peninsula 270 and island 272 are passivation buffers that help relieve physical pressure between UBM 222 and die 104, thus improving resilience to thermal cycling and other physical pressures on semiconductor die 104. Stacked via structures such as vias 204 and 254 have better electrical characteristics than having horizontal conductive traces connecting one via to the other, but also creates higher physical stress at the interface between layers that can cause delamination. The buffers reduce interface stress between conductive layers, including between the top conductive layer and UBM 222.

Figure 6A:
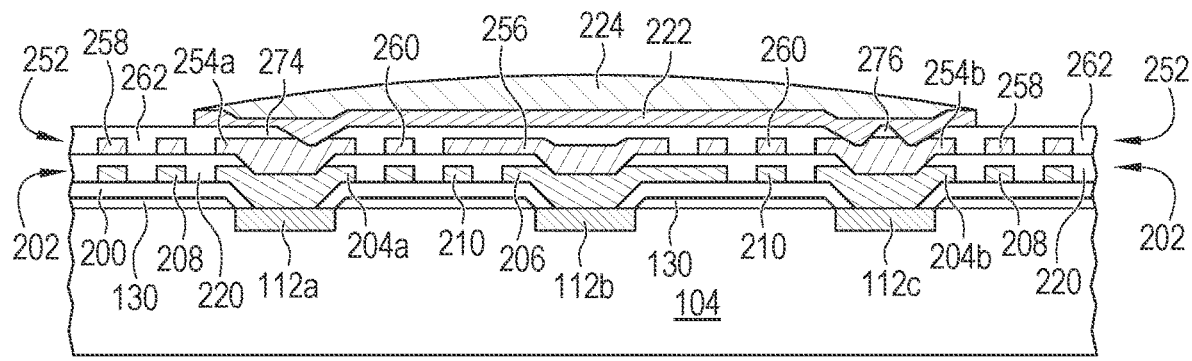
FIGS. 6a-6c illustrate additional buffer layer embodiments.
Figure 6B:
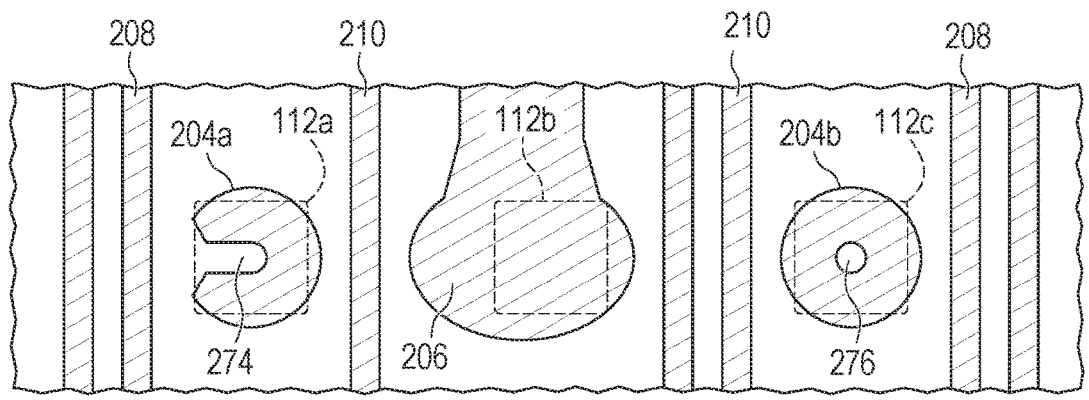

FIGS. 6a and 6b illustrate passivation buffers formed over contact pads 254a and 254b. Insulating layer 262 is patterned to form a peninsula 274 over contact pad 254a and an island 276 over contact pad 254b. Both buffers could be peninsulas or islands, but one of each is shown for purposes of illustration. When more than two contact pads 254 are formed over die 104, any combination of islands and peninsulas can be used. Contact pad 254a is optionally elongated in a direction perpendicular to peninsula 274 to create more surface area on the sides of the peninsula.

Figure 6C:
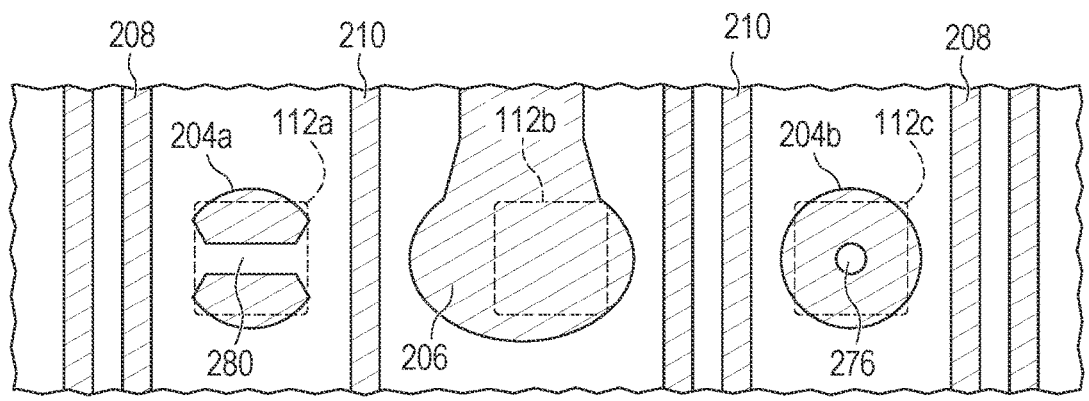

FIG. 6c shows a bridge 280 bisecting contact pad 254a into two discrete exposed portions. Contact pad 254a is elongated perpendicularly to bridge 280 in other embodiments to increase the size of the discrete exposed portions. Any combination of bridges, peninsulas, and islands can be used on any of the stacked contact pads of conductive layers 202 and 252 as buffer layers to relieve physical pressure between UBM 222 and die 104. Both conductive layer 202 and conductive layer 252 could have buffers on their respective contact pads. The buffers reduce interface stress between conductive layers.

Figure 7:
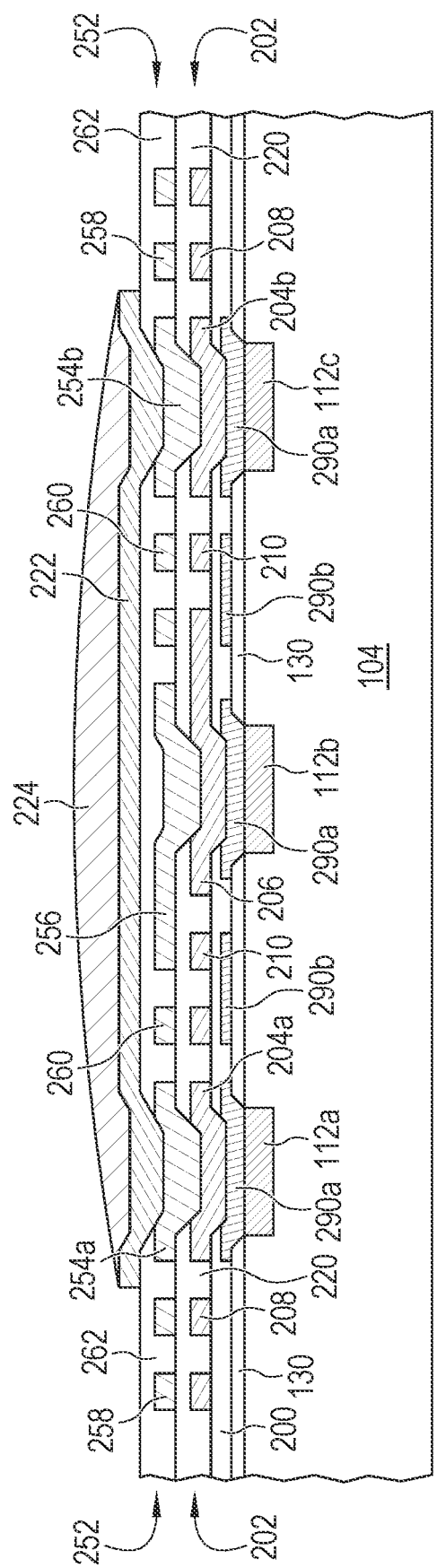
FIG. 7 illustrates a conductive layer buffer.

FIG. 7 illustrates a buffer conductive layer 290 formed between die pads 112 and conductive layer 202. Conductive layer 290 is typically formed from a softer metal, such as copper, to add some flexibility into the contact pad stacks. The slight compressibility of conductive layer 290 helps relieve some of the physical stress on stacked contact pads 204 and 254. The interface between contact pads 204, which are typically aluminum, and die pads 112 can commonly be the weakest link in the stack. Conductive layer 290 includes contact pads 290 and traces 290b. Adding a copper layer between contact pads 204 and die pads 112 increases reliability.

After encapsulating die 104, building up all desired RDL layers, forming all desired UBM 222 and solder bumps 224, and performing any other desired packaging steps, a completed semiconductor package with semiconductor die 104 is formed. The semiconductor package can be any suitable type of package, e.g., multi-chip module (MCM), system-in-package (SiP) module, ball grid array (BGA), or embedded wafer-level ball grid array (eWLB). In the completed package, one or more solder bumps 224 are exposed to allow subsequent integration into a larger electrical system. A device manufacturer will integrate the package by picking and placing the package over a larger substrate and reflowing solder bumps 224 onto contact pads of the larger substrate.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
   providing a semiconductor die;
   forming a conductive layer over the semiconductor die;
   patterning the conductive layer to form a first contact pad, a second contact pad, and a third contact pad;
   forming a buffer conductive layer between the semiconductor die and first contact pad; and
   forming an under-bump metallization layer (UBM) directly on and physically contacting the first contact pad and second contact pad, wherein the UBM electrically connects the first contact pad to the second contact pad and the third contact pad is electrically isolated from the UBM.

2. The method of claim 1, further including patterning the conductive layer to form a conductive trace extending between the first contact pad and second contact pad under the UBM without physically contacting the first contact pad or second contact pad.

3. The method of claim 1, further including forming an insulating layer over the first contact pad and second contact pad comprising a buffer feature of the insulating layer disposed over the first contact pad.

4. The method of claim 1, further including:
   forming an insulating layer over the conductive layer;
   forming a first opening in the insulating layer over the first contact pad;
   forming a second opening in the insulating layer over the second contact pad; and
   forming the UBM over the insulating layer, wherein the UBM extends through the first opening and second opening to physically contact the first contact pad and second contact pad, and wherein the insulating layer remains completely covering the third contact pad to electrically isolate the third contact pad from the UBM.

5. A method of making a semiconductor device, comprising:
   providing a semiconductor die;
   forming a first contact pad over the semiconductor die;
   forming a second contact pad over the semiconductor die;
   forming a conductive trace extending between the first contact pad and second contact pad; and
   forming an under-bump metallization layer (UBM) directly over and within a footprint of the first contact pad and second contact pad, wherein the conductive trace is disposed under the UBM.

6. The method of claim 5, further including forming an insulating layer over the first contact pad and second contact pad comprising a buffer feature of the insulating layer disposed over the first contact pad.

7. The method of claim 5, further including:
   forming a third contact pad over the first contact pad;
   forming a fourth contact pad over the second contact pad; and
   forming the UBM over the third contact pad and fourth contact pad.

8. The method of claim 5, further including forming a buffer conductive layer between the semiconductor die and first contact pad.

9. The method of claim 5, further including forming a third contact pad under the UBM, wherein the UBM electrically connects the first contact pad to the second contact pad and the third contact pad is electrically isolated from the UBM.

10. The method of claim 5, further including a solder bump formed directly on and physically contacting the UBM.

11. A semiconductor device, comprising:
    a semiconductor die;
    a conductive layer formed over the semiconductor die, wherein the conductive layer is patterned to form a first contact pad, a second contact pad, and a third contact pad;
    an under-bump metallization layer (UBM) formed directly on and physically contacting the first contact pad and second contact pad, wherein the UBM electrically connects the first contact pad to the second contact pad and the third contact pad is electrically isolated from the UBM;
    a fourth contact pad formed under the first contact pad; and
    a fifth contact pad formed under the second contact pad, wherein the UBM is formed over the fourth contact pad and fifth contact pad.

12. The semiconductor device of claim 11, further including a conductive trace extending between the first contact pad and second contact pad under the UBM without physically contacting the first contact pad or second contact pad.

13. The semiconductor device of claim 11, further including an insulating layer formed over the first contact pad and second contact pad comprising a buffer feature of the insulating layer disposed over the first contact pad.

14. The semiconductor device of claim 11, further including:
    a first conductive trace formed between the first contact pad and second contact pad; and
    a second conductive trace formed between the fourth contact pad and fifth contact pad.

15. The semiconductor device of claim 11, further including an insulating layer formed over the conductive layer, wherein the UBM is formed over the insulating layer, wherein the UBM extends through a first opening in the insulating layer to physically contact the first contact pad, wherein the UBM extends through a second opening in the insulating layer to physically contact the second contact pad, and wherein the insulating layer completely covers the third contact pad to electrically isolate the third contact pad from the UBM.

16. The semiconductor device of claim 11, wherein the third contact pad is directly between the first contact pad and second contact pad.

17. The semiconductor device of claim 11, further including a solder bump formed directly on and physically contacting the UBM.

18. A semiconductor device, comprising:
- a semiconductor die;
- a first contact pad formed over the semiconductor die;
- a second contact pad formed over the semiconductor die;
- an under-bump metallization layer (UBM) formed directly over and within a footprint of the first contact pad and second contact pad; and
- a conductive trace extending between the first contact pad and second contact pad under the UBM.

19. The semiconductor device of claim 18, further including:
- a third contact pad formed over the first contact pad; and
- a fourth contact pad formed over the second contact pad, wherein the UBM is formed over the third contact pad and fourth contact pad.

20. The semiconductor device of claim 18, further including a buffer conductive layer formed between the semiconductor die and first contact pad.

21. The semiconductor device of claim 18, further including a third contact pad formed under the UBM, wherein the UBM electrically connects the first contact pad to the second contact pad and the third contact pad is electrically isolated from the UBM.

* * * * *